(12) United States Patent
Todorov et al.

(10) Patent No.: US 10,936,944 B2
(45) Date of Patent: *Mar. 2, 2021

(54) THREE-TERMINAL NEUROMORPHIC VERTICAL SENSING

(71) Applicant: INTERNATIONAL BUSINESS MACHINES CORPORATION, Armonk, NY (US)

(72) Inventors: Teodor K. Todorov, Yorktown Heights, NY (US); John Rozen, Hastings on Hudson, NY (US); Douglas M. Bishop, New York City, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/548,106

(22) Filed: Aug. 22, 2019

(65) Prior Publication Data
US 2019/0378004 A1    Dec. 12, 2019

Related U.S. Application Data

(63) Continuation of application No. 16/001,336, filed on Jun. 6, 2018, now Pat. No. 10,467,524.

(51) Int. Cl.
*G06N 3/063*    (2006.01)
*H01L 45/00*    (2006.01)

(52) U.S. Cl.
CPC ....... *G06N 3/0635* (2013.01); *H01L 45/1206* (2013.01); *H01L 45/145* (2013.01); *H01L 45/146* (2013.01); *H01L 45/1608* (2013.01)

(58) Field of Classification Search
None
See application file for complete search history.

(56) References Cited

U.S. PATENT DOCUMENTS

| | | | |
|---|---|---|---|
| 4,839,700 | A | 6/1989 | Ramesham et al. |
| 8,093,575 | B2 | 1/2012 | Xia et al. |
| | | (Continued) | |

FOREIGN PATENT DOCUMENTS

| | | |
|---|---|---|
| CN | 104201281 A | 12/2014 |
| CN | 107068708 A | 8/2017 |
| | (Continued) | |

OTHER PUBLICATIONS

Fuller, Elliot J.; "Li-Ion Synaptic Transistor for Low Power Analog Computing", Advanced Science News, Advanced Materials, Adv. Mater. 2017, 29, 1604310, 8 pages.
(Continued)

*Primary Examiner* — Hsien Ming Lee
(74) *Attorney, Agent, or Firm* — Cantor Colburn LLP; Randall Bluestone

(57) ABSTRACT

A neuromorphic device includes a first electrode layer arranged on a substrate, and an electrolyte layer arranged on the first electrode layer. The electrolyte layer includes a solid electrolyte material. The neuromorphic device further includes an ion permeable, electrically conductive membrane arranged on the electrolyte layer and an ion intercalation layer arranged on the ion permeable, electrically conductive membrane. The neuromorphic device includes a second electrode layer arranged on the ion intercalation layer.

16 Claims, 14 Drawing Sheets

(56) References Cited

U.S. PATENT DOCUMENTS

| | | | |
|---|---|---|---|
| 9,231,198 B2 | 1/2016 | Hwang et al. | |
| 9,449,979 B2 | 9/2016 | McKinnon et al. | |
| 9,755,144 B2 | 9/2017 | Sills | |
| 10,467,524 B1* | 11/2019 | Todorov | H01L 45/1206 |
| 2010/0264397 A1 | 10/2010 | Xia | |
| 2011/0175052 A1 | 7/2011 | Hwang et al. | |
| 2012/0081774 A1 | 4/2012 | De Paiva Martins et al. | |
| 2015/0207067 A1 | 7/2015 | Doolittle et al. | |
| 2016/0111640 A1 | 4/2016 | Chang et al. | |
| 2016/0172365 A1 | 6/2016 | McKinnon et al. | |
| 2016/0276587 A1 | 9/2016 | Sills | |
| 2016/0370681 A1* | 12/2016 | Han | H01L 31/1808 |
| 2017/0213958 A1 | 7/2017 | Kim et al. | |
| 2018/0026183 A1 | 1/2018 | Liu et al. | |
| 2018/0312986 A1* | 11/2018 | Dalla Corte | C25C 3/00 |

FOREIGN PATENT DOCUMENTS

| | | |
|---|---|---|
| DE | 102004052645 A1 | 5/2006 |
| WO | 2015154695 A1 | 10/2015 |
| WO | 2018004625 A1 | 1/2018 |

OTHER PUBLICATIONS

Teodor K. Todorov, et al., "Three-Terminal Neuromorphic Vertical Sensing", U.S. Appl. No. 16/001,336, filed Jun. 6, 2018.

Teodor K. Todorov, et al., "Three-Terminal Neuromorphic Vertical Sensing", U.S. Appl. No. 16/548,050, filed Aug. 22, 2019.

* cited by examiner

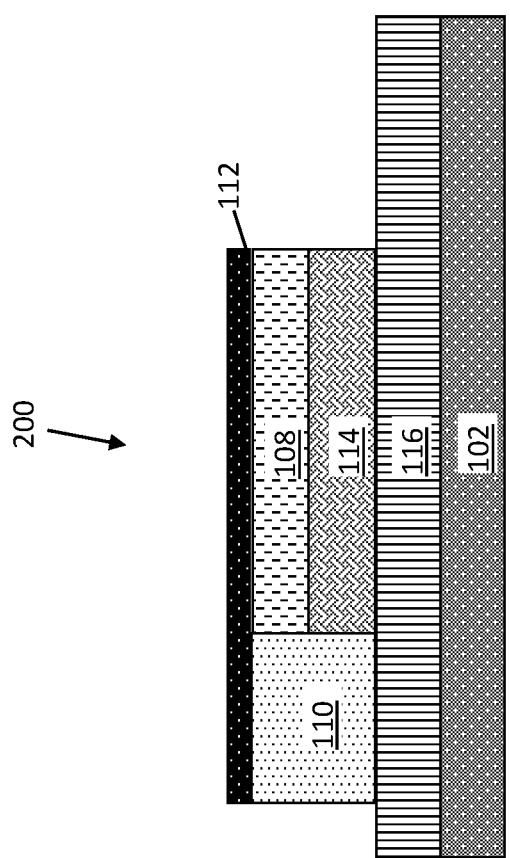

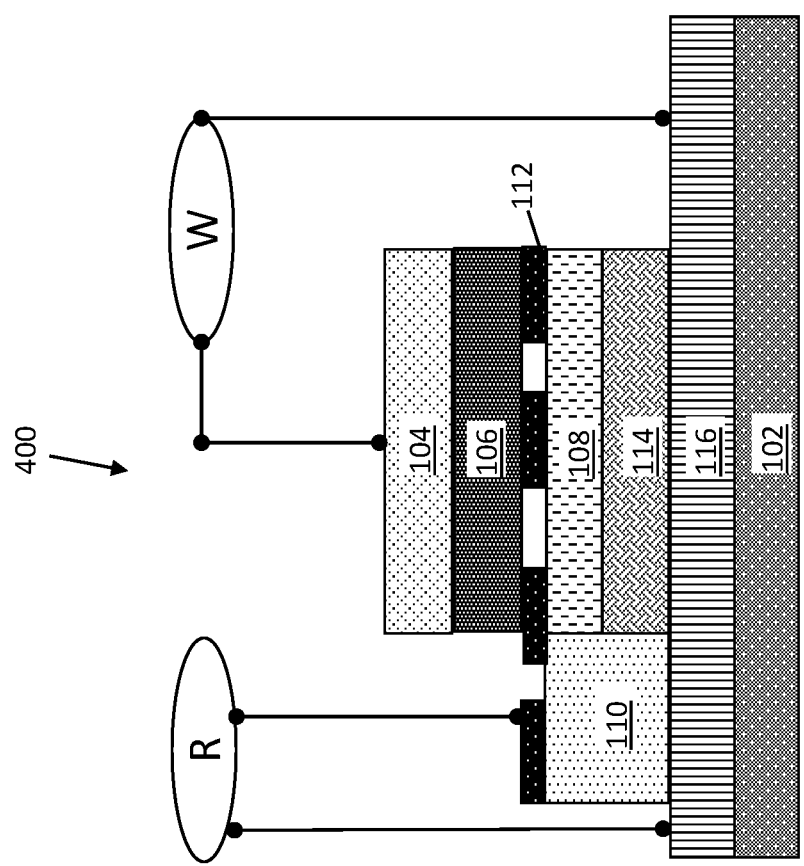

THREE-TERMINAL NEUROMORPHIC VERTICAL SENSING

DOMESTIC PRIORITY

This application is a continuation of and claims priority from U.S. patent application Ser. No. 16/001,336, filed on Jun. 6, 2018, the entire contents of which are incorporated herein by reference.

BACKGROUND

The present invention generally relates to neuromorphic computing. More specifically, the present invention relates to three-terminal neuromorphic devices for vertical sensing.

Scaling in complementary metal-oxide-semiconductor (CMOS) has led to growing interest in alternative computing devices, for example, neuromorphic computing devices. Neuromorphic computing uses very-large-scale integration (VLSI) systems, including electronic analog circuits, to mimic neuro-biological architectures present in the nervous system. On the hardware level, memristors, threshold switches, and transistors, for example, can be used to implement neuromorphic computing devices.

SUMMARY

Embodiments of the present invention are directed to a neuromorphic device. A non-limiting example of the neuromorphic device includes a first electrode layer arranged on a substrate, and an electrolyte layer arranged on the first electrode layer. The electrolyte layer includes a solid electrolyte material. The neuromorphic device further includes an ion permeable, electrically conductive membrane arranged on the electrolyte layer and an ion intercalation layer arranged on the ion permeable, electrically conductive membrane. The neuromorphic device includes a second electrode layer arranged on the ion intercalation layer.

Another non-limiting example of the neuromorphic device includes a first electrode layer arranged on a substrate, and an ion intercalation layer arranged on the first electrode layer. The neuromorphic device includes an electrolyte layer arranged on the ion intercalation layer. The electrolyte layer includes a solid electrolyte material. The neuromorphic device includes an ion permeable, electrically conductive membrane arranged on the electrolyte layer and a second electrode layer arranged on the ion intercalation layer.

Embodiments of the present invention are directed to a method of fabricating a neuromorphic device. A non-limiting example of the method includes disposing a first electrode layer on a substrate, and disposing an electrolyte layer on the first electrode layer. The electrolyte layer includes a solid electrolyte material. The method includes disposing an ion permeable, electrically conductive membrane on the electrolyte layer, and disposing a second electrode layer arranged on the ion permeable, electrically conductive membrane.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A-1G depict a process flow for fabricating a neuromorphic device according to embodiments of the invention, in which:

FIG. 1A is a cross-sectional side view of a conductive layer arranged on a substrate;

FIG. 1B is a cross-sectional side view of a reservoir layer arranged on the conductive layer;

FIG. 1C is a cross-sectional side view of an electrolyte layer arranged on the reservoir layer;

FIG. 1D is a cross-sectional side view after patterning and etching and depositing a dielectric layer;

FIG. 1E is a cross-sectional side view after forming a conductive membrane on the electrolyte layer;

FIG. 1F is a cross-sectional side view of a matrix layer arranged on the conductive membrane; and FIG. 1G is a cross-sectional side view of a metal layer arranged on the matrix layer after patterning and etching, and operation of the neuromorphic device; and FIGS. 2A-2E depict a process flow for fabricating a neuromorphic device according to embodiments of the invention, in which:

FIG. 2A is a cross-sectional side view of a metal layer arranged on a substrate;

FIG. 2B is a cross-sectional side view of a matrix layer and an electrolyte layer arranged on the metal layer;

FIG. 2C is a cross-sectional side view after patterning and etching and depositing a dielectric layer and a conductive membrane;

FIG. 2D is a cross-sectional side view of a reservoir layer and a metal layer arranged on the conductive membrane, after patterning and etching; and FIG. 2E is a cross-sectional side view illustrating the operation of the neuromorphic device;

FIG. 4 depicts a neuromorphic device according to embodiments of the invention.

Figure 1A:
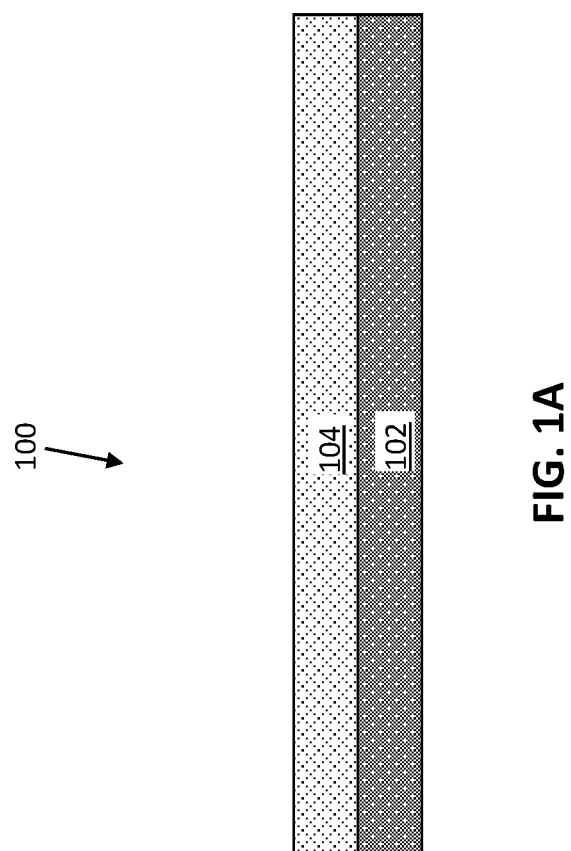

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Devices utilizing ion-motion have gained increasing research interest due to potential applications as a reconfigurable memory for storage or analog memrister for neuromorphic computing. This concept is attractive because the devices easily allow multiple states, while also being nonvolatile and requiring low power for programming. Device physics and experimental results show improved switching symmetry which is essential for efficient neuromorphic computing and a current roadblock for many competing technologies. Ion-intercalation devices commonly rely on lithium due to understanding from the battery industry.

Turning now to an overview of technologies that are more specifically relevant to aspects of the invention, lithium ion ($Li^+$) intercalation materials, for example, $LiCoO_2$, that exhibit resistivity changes as a function of lithium content have been proposed for neuromorphic and analog computing applications, such as synaptic transistors. Lithium ion synaptic transistors include three terminals and are solid state, nonvolatile oxidation-reduction (redox) transistors with a resistance switching mechanism based on intercalation of lithium ion dopants into a channel (e.g., a $LiCoO_2$ channel). The lithium ion dopants cannot diffuse out of the channel, however, without an external source of charge to facilitate oxidation and liberate them as ions into a surrounding electrolyte. Lithium ion transistors are advantageous for neuromorphic applications because they use the low energy process of ion insertion/extraction for resistance switching, which means that small voltages can be used. Despite these advantages, impractically long response times and transient resistance behavior has been observed in such devices due to slow and possibly anisotropic lateral lithium ion diffusion across the planar channel between the source and drain in the classical transistor architecture. In the typical architecture, the ion motion is transverse to the direction of electrical read operation to determine the state of the device. This can mean that the above challenges with anisotropic material properties, slow transient behavior, and non-uniform electric fields can be amplified.

Turning now to an overview of the aspects of the invention, one or more embodiments of the invention address the above-described shortcomings of the prior art by providing a vertically integrated lithium intercalation device for neuromorphic and analog computing applications, in which uniaxial ionic and electrical control is achieved via vertically stacking all device elements. Ionic transport is facilitated via an electrically conductive and lithium ion permeable layer, which serves as a drain.

The above-described aspects of the invention address the shortcomings of the prior art by providing an architecture that decouples the device footprint and base channel resistance fixed by the matrix thickness. In the proposed vertical architecture, the channel for reading occurs between two vertical contacts. The device extent is defined (in top down orientation) by the length and width of the channel/device, which can be anywhere from, for example, 1×1 nm to 100×100 microns, depending on required density, while the thickness of the device can be between ~1 nm to 1 micron as needed to ensure multiple states and fast device response. The channel resistance therefore increases with thickness and decreases with increasing top down area. The architecture also renders the current or voltage-driven gate write field uniform across the channel length. The inventive devices and fabrication methods provide a reduced ionic diffusion path and fast homogenous lithium ion distribution, which proves improved response times and mitigated transient behavior.

Turning now to a more detailed description of aspects of the present invention, FIGS. 1A-1H depict a process flow for fabricating a neuromorphic device 100 according to embodiments of the invention. FIG. 1A is a cross-sectional side view of a conductive layer 104 arranged on a substrate 102. The conductive layer 104 includes one or more conductive materials, such as one or more metals. The conductive layer 104 forms the bottom electrode or gate electrode.

Non-limiting examples of suitable conductive metals for the conductive layer 104 include aluminum (Al), platinum (Pt), gold (Au), tungsten (W), titanium (Ti), or any combination thereof. The conductive metals can be deposited by a suitable deposition process, for example, CVD, PECVD, PVD, plating, thermal or e-beam evaporation, or sputtering.

The substrate 102 includes one or more dielectric materials. Non-limiting examples of dielectric materials include silicon oxide, silicon oxynitride, silicon nitride, or a combination thereof. The substrate 102 material can also include glass, a polymer, or a combination thereof.

Figure 1B:
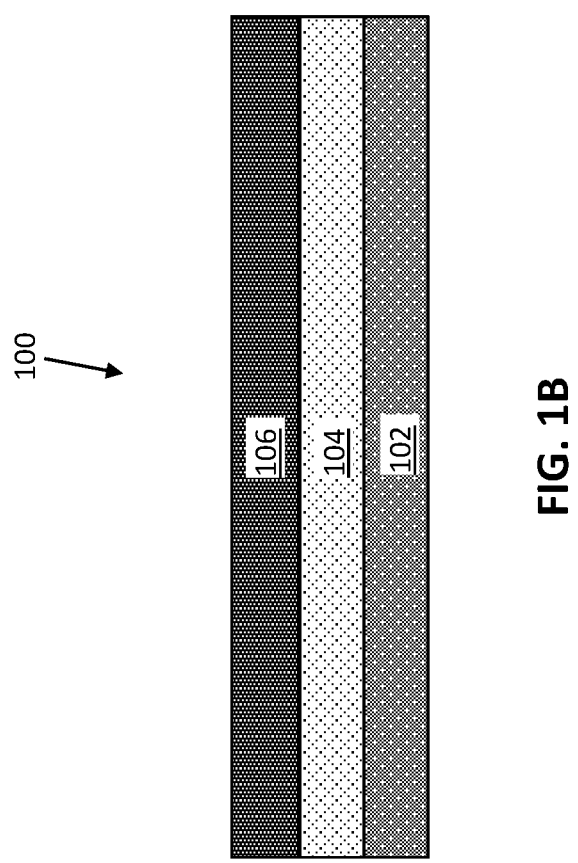

FIG. 1B is a cross-sectional side view of a reservoir layer 106 arranged on the conductive layer 104. The reservoir layer 106 is an ion reserve, such as a lithium ion reservoir, that stores excess lithium ions. According to one or more embodiments, the reservoir is composed of a lithium ion lithium intercalation compound, such as lithium cobalt oxide ($LiCoO_2$). In another embodiment, the lithium metal serves as the reservoir. The reservoir layer 106 is deposited on the conductive layer 104 by, for example, CVD, PECVD, PVD, plating, thermal or e-beam evaporation, or sputtering. According to one or more embodiments, the reservoir layer 106 has a thickness of about 0.1 to about 200 nm. Yet, the thickness of the reservoir layer 106 is not intended to be limited and can be tailored to the particular application.

Figure 1C:
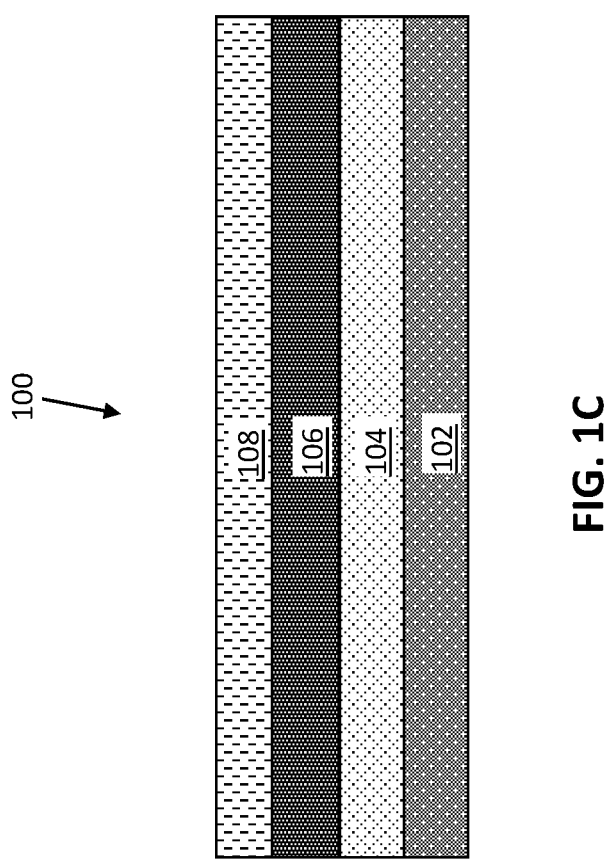

FIG. 1C is a cross-sectional side view of an electrolyte layer 108 arranged on the reservoir layer 106. The electrolyte layer 108 includes an ion conductive, electrically insulating solid material. The electrolyte layer 108 is lithium ion conductive and includes lithium phosphorus oxynitride (LiPON) according to one or more embodiments. The electrolyte layer 108 can include any solid electrolyte suitable for lithium ion batteries, for example. According to one or more embodiments, the electrolyte layer 108 has a thickness of about 1 to about 500 nm. Yet, the thickness of the electrolyte layer 108 is not intended to be limited and can be tailored to the particular application.

Figure 1D:
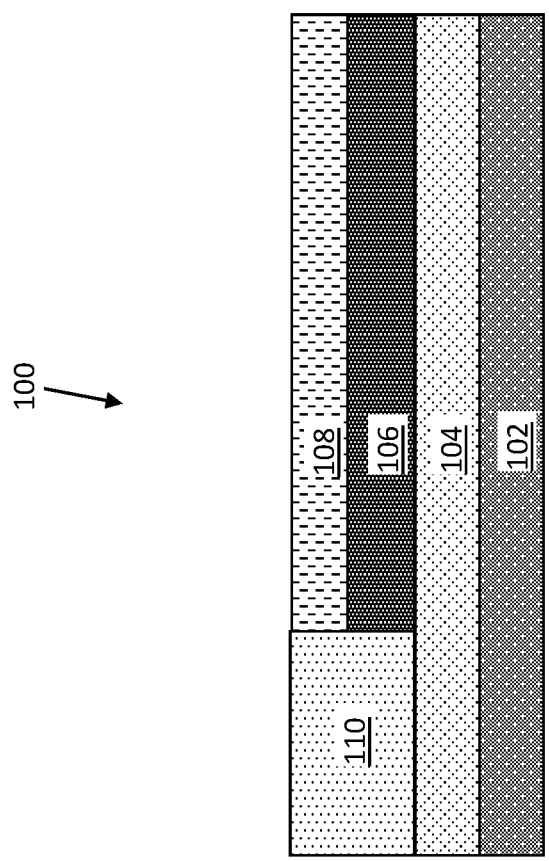

FIG. 1D is a cross-sectional side view after patterning and etching the reservoir layer 106 and electrolyte layer 108 and depositing a dielectric layer 110. One or more lithography and/or etching processes are performed to remove a portion of each of the reservoir layer 106 and electrolyte layer 108 to expose the conductive layer 104 (the gate). The dielectric layer 110 is then deposited on the exposed area of the conductive layer 104, which functions to separate the gate from the conductive membrane 112 forming the drain, described with respect to FIG. 1E below. Non-limiting examples of dielectric materials for the dielectric layer 110 include silicon oxide, silicon oxynitride, silicon nitride, or a combination thereof.

Figure 1E:
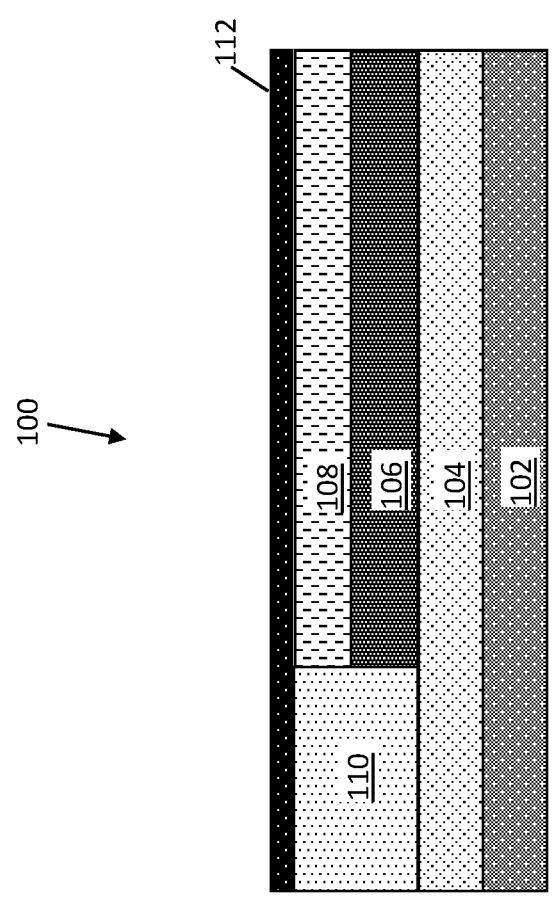

FIG. 1E is a cross-sectional side view after forming a conductive membrane 112 on the electrolyte layer 108. The conductive membrane 112 is electrically conductive, ion permeable, and serves as a drain electrode. The conductive membrane 112 is lithium ion permeable according to some embodiments. The conductive membrane 112 includes a thin layer of metal according to one or more embodiments. According to other embodiments, the conductive membrane 112 includes a thin layer of amorphous carbon or crystalline carbon. The conductive membrane 112 can be a thin solid layer, as shown in FIG. 1E, or a porous or discontinuous layer (see FIGS. 3 and 4). The conductive membrane can include a porous or patterned material that contacts the second intercalation layer (reservoir layer 106). According to some embodiments, the conductive membrane 112 includes, for example, gold, aluminum, platinum, tungsten, titanium, or a combination thereof. According to one or more embodiments, the conductive membrane 112 has a thickness of about 0.1 to about 100 nm. Yet, the thickness of the conductive membrane 112 is not intended to be limited and can be tailored to the particular application. The conductive membrane 112 is deposited on the electrolyte layer 108 by any suitable method, which depends on the type of material. The material forming the conductive membrane 112 can be deposited by, for example, CVD, PECVD, PVD, plating, thermal or e-beam evaporation, or sputtering.

Figure 1F:
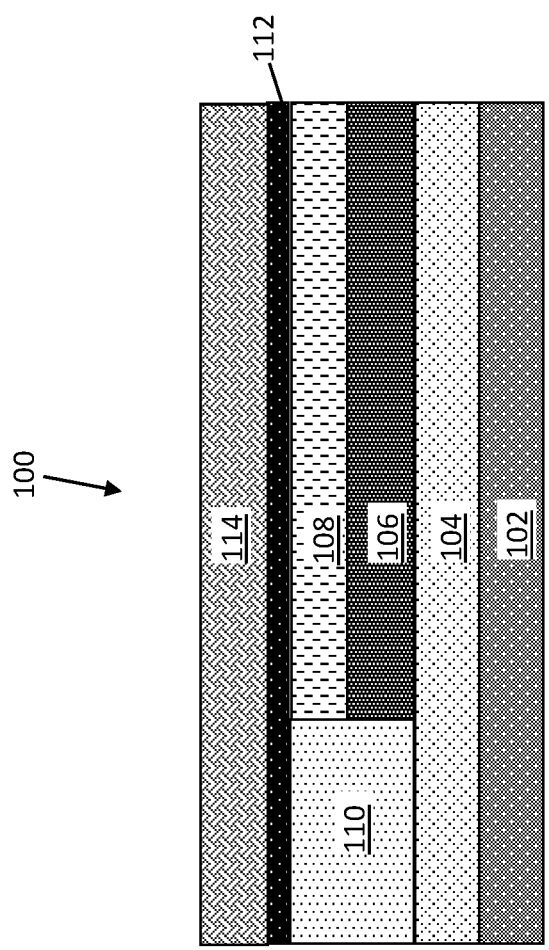

FIG. 1F is a cross-sectional side view of a matrix layer 114 arranged on the conductive membrane 112. The matrix layer 114 changes resistivity with the lithium ion content. The matrix layer can accept Li ions, which changes the valence states of host matrix atoms, and in turn creates free electrons on intercalation. Many metal oxides show resistance change upon dopant ion intercalation. The matrix layer 114 can include a material that is the same or different than the reservoir layer 106. According to one or more embodiments, the matrix layer 114 includes titanium oxide ($TiO_2$), tungsten oxide ($WO_3$), lithium cobalt oxide, transition metal oxides (e.g., $V_2O_5$, $CeO_2$), lithium titanate (LTO) ($Li_4Ti_5O_{12}$), or a combination thereof. According to one or more embodiments, the matrix layer 114 has a thickness of about 1 to about 500 nm. Yet, the thickness of the matrix layer 114 is not intended to be limited and can be tailored to the particular application.

Figure 1G:
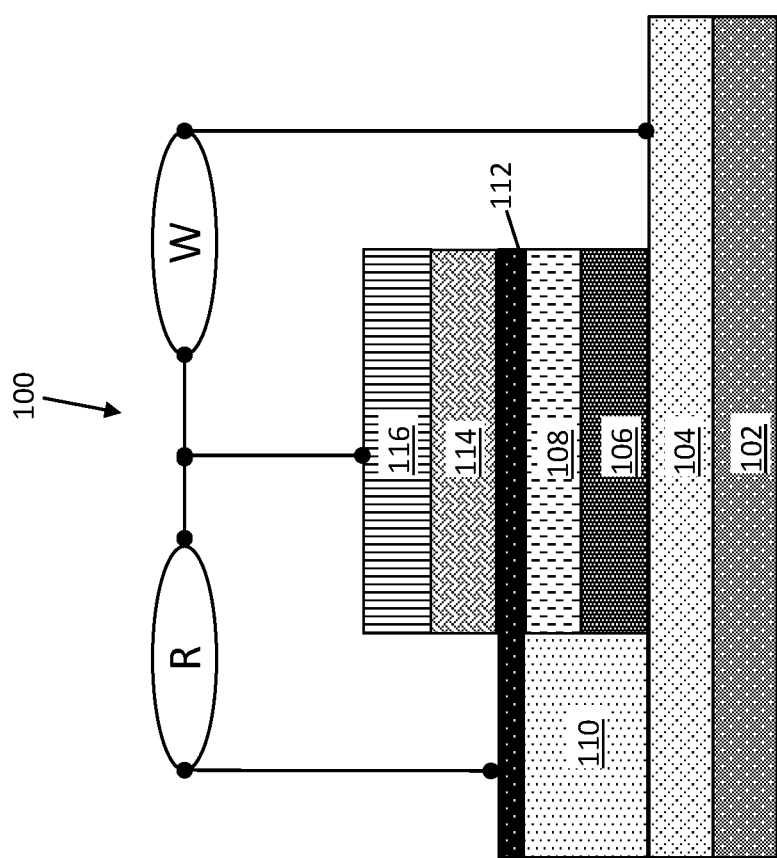

FIG. 1G is a cross-sectional side view of a metal layer 116 arranged on the matrix layer 114, after patterning and etching. The metal layer 116 forms the source electrode. The metal layer 116 includes one or more conductive metals, including, but not limited to, aluminum, platinum, gold, titanium, tungsten, or a combination thereof. The conductive metals can be deposited by a suitable deposition process, for example, CVD, PECVD, PVD, plating, thermal or e-beam evaporation, or sputtering. According to one or more embodiments, the metal layer 116 has a thickness of about 1 to about 200 nm. Yet, the thickness of the metal layer 116 is not intended to be limited and can be tailored to the particular application.

FIG. 1G also illustrates the reading and writing operations of the neuromorphic device 100. The neuromorphic device is operated by sending current or voltage pulses to the gate electrode (conductive layer 104). The current or voltage pulses include a "write" operation (W) (a finite current or voltage pulse) and a "read" operation (R) (a voltage pulse). During controlled operation, the writing and reading pulses alternate. During the "write" pulse, the electric field drives lithium ions from the reservoir into the matrix material which changes the matrix conductance. The conductance change can be reversed by a pulse in the opposite polarity which drives lithium ions out of the matrix. The conductance state of the matrix is sensed during the "read" operation. Resistance switching occurs as ions (e.g., lithium ions) reversibly move in and out of the channel, defined by the reservoir layer 106. The resistance is read (R) between the source (metal layer 116) and drain (conductive membrane 112). A write (W) operation occurs between the source (metal layer 116) and gate (conductive layer 104).

According to one or more embodiments, when the channel (reservoir layer 106) includes lithium cobalt oxide, the following reaction occurs:

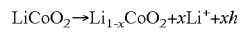

Scheme 1

In Scheme 1, the removal of Li oxidizes Co from valence $3^+$ to $4^+$ and generates positive polarons. As the fraction x in $Li_{1-x}$ is varied from 0 to 0.5, the channel material undergoes a transition from insulator to metal, as well as an increase in electronic conductivity. As channel material is reversible, a positive voltage re-intercalates Li ions (reducing Co from $4^+$ to $3^+$) and returns the channel to its initial conductivity.

Figure 2A:
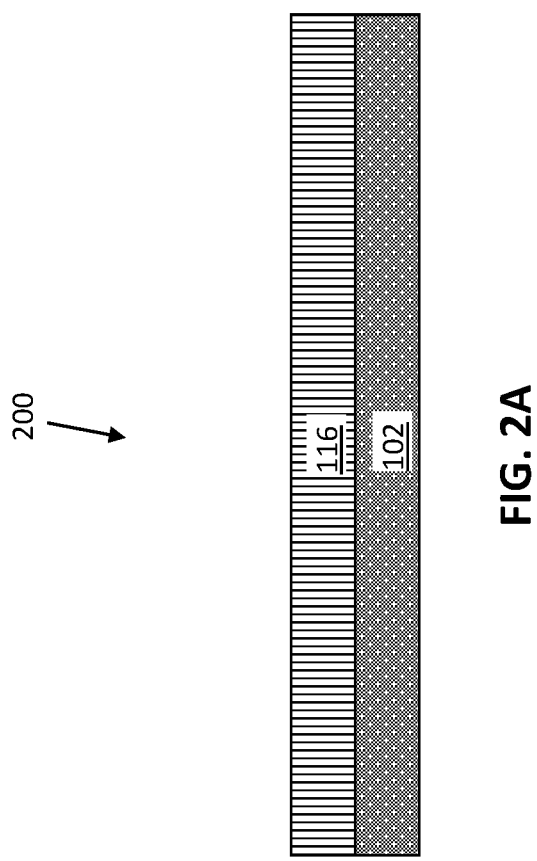

FIGS. 2A-2E depict a process flow for fabricating a neuromorphic device 200 according to embodiments of the invention. FIG. 2A is a cross-sectional side view of a metal layer 116 arranged on a substrate 102. The metal layer 116 forms the source electrode. The substrate 102 includes one or more dielectric materials.

Figure 2B:
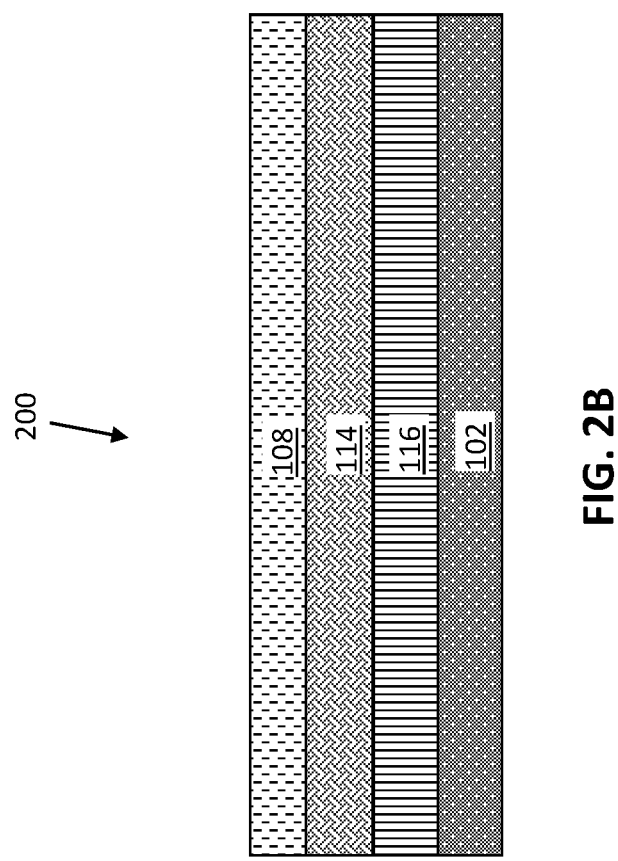

FIG. 2B is a cross-sectional side view of a matrix layer 114 and an electrolyte layer 108 arranged on the metal layer 116 (source). The matrix layer 114 is arranged between the electrolyte layer 108 and the metal layer 116.

FIG. 2C is a cross-sectional side view after patterning and etching and depositing a dielectric layer 110 and a conductive membrane 112. One or more lithography and/or etching processes are performed to remove a portion of each of the matrix layer 114 and electrolyte layer 108 to expose the metal layer 116 (source). The dielectric layer 110 is then deposited on the exposed area of the metal layer 116, which functions to separate the source from the conductive membrane 112 forming the drain electrode.

Figure 2D:
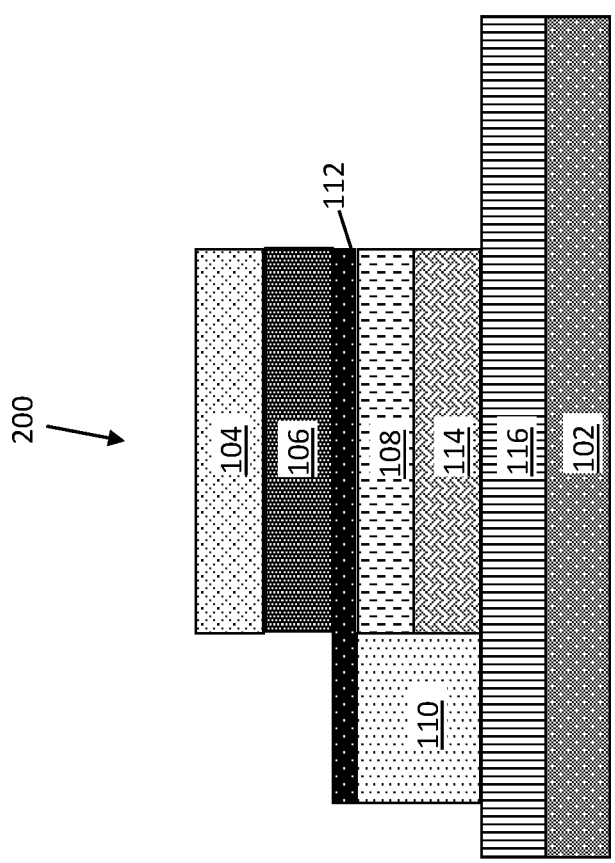

FIG. 2D is a cross-sectional side view of a reservoir layer 106 (channel) and a conductive layer 104 (gate electrode) arranged on the conductive membrane 112 (drain electrode). After depositing the reservoir layer 106 and the conductive layer 104 (gate), one or more lithography and etching processes are performed to remove portions of each such that the conductive membrane 112 (drain) is exposed.

Figure 2E:
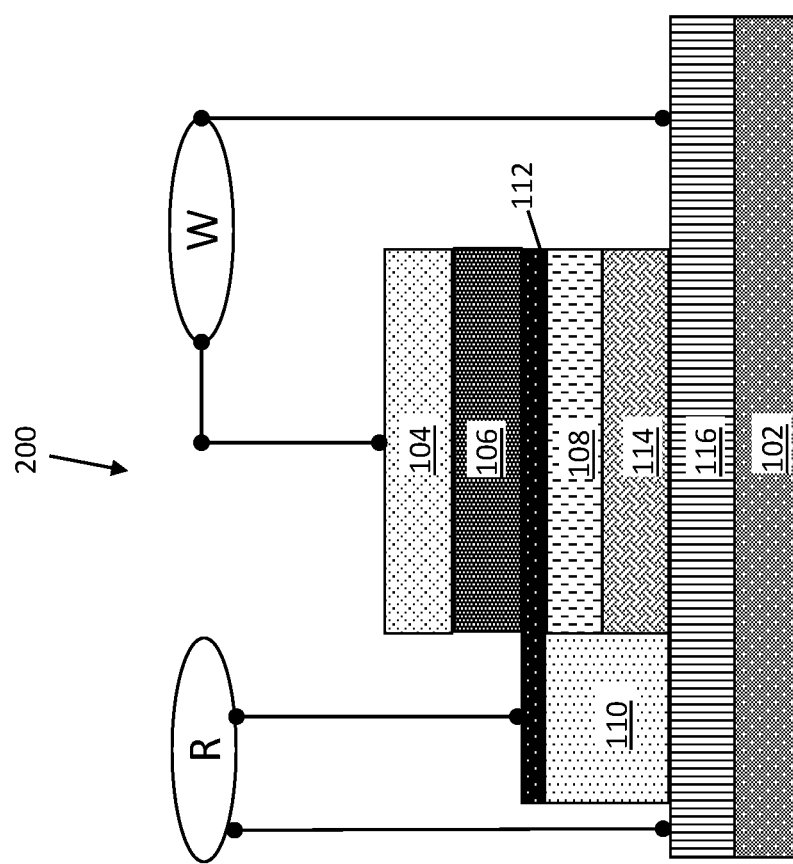

FIG. 2E is a cross-sectional side view illustrating the reading and writing operations of the neuromorphic device 200. The resistance is read (R) between the source electrode (metal layer 116) and drain electrode (conductive membrane 112). A write (W) operation occurs between the source electrode (metal layer 116) and gate electrode (conductive layer 104).

Figure 3:
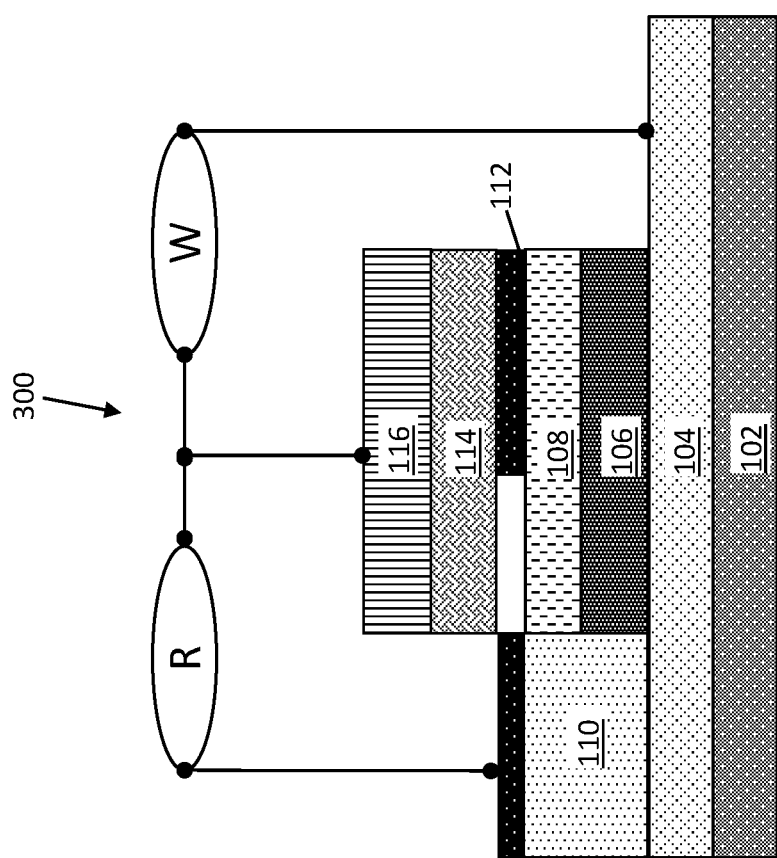
FIG. 3 depicts a neuromorphic device according to embodiments of the invention.

FIG. 3 depicts a neuromorphic device 300 according to embodiments of the invention, and FIG. 4 depicts a neuromorphic device 400 according to embodiments of the invention. The conductive membrane 112 is a discontinuous or perforated carbon or metal layer. The conductive membrane 112 includes, for example, nanostructured material(s), such as nanoporous materials, nanowires, nanotubes (e.g., graphene nanotubes), or nanoparticles. The conductive membrane 112 includes, for example, carbon, metal, or a combination thereof.

The neuromorphic devices 100, 200, 300, 400 described above are three terminal devices that include an ion (e.g., lithium ion) permeable, electrically conductive membrane 112 that allows both ionic motion and electrical reading along the vertical axis of the device. Neuromorphic devices 100, 200, 300, 400 are but examples for device integration that provide contact to the drain electrode, formed by the conductive membrane 112, in addition to a readily accessible source electrode (metal layer 116) and gate electrode (conductive layer 104) arranged on top and bottom vertical surfaces of the stack. Vertical stacking of the source, drain, and gate electrodes reduces lateral transient movement of ions and provides unidirectional and uniform uptake of ions into the channel.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A neuromorphic device comprising:
   an electrolyte layer arranged on a gate electrode;
   a drain electrode arranged on the electrolyte layer, the drain electrode comprising a porous material;
   an ion intercalation layer arranged on the drain electrode; and
   a source electrode arranged on the ion intercalation layer.

2. The neuromorphic device of claim 1 further comprising a second ion intercalation layer arranged between the electrolyte layer and the gate electrode, and the second ion intercalation layer comprises lithium cobalt oxide.

3. The neuromorphic device of claim 2, wherein the electrolyte layer comprises a solid electrolyte material.

4. The neuromorphic device of claim 1, wherein the drain electrode comprises a patterned material.

5. The neuromorphic device of claim 1, wherein the ion intercalation layer is titanium oxide, tungsten oxide, lithium cobalt oxide, or a combination thereof.

6. The neuromorphic device of claim 1, wherein the drain electrode comprises an ion permeable, electrically conductive membrane.

7. The neuromorphic device of claim 1, wherein the drain electrode is carbon, metal, or a combination thereof.

8. The neuromorphic device of claim 1, wherein the electrolyte layer comprises lithium phosphorus oxynitride.

9. A neuromorphic device comprising:
   an electrolyte layer arranged on a gate electrode, the electrolyte layer comprising an ion permeable layer;
   a drain electrode arranged on the electrolyte layer;
   an ion intercalation layer arranged on the drain electrode; and
   a source electrode arranged on the ion intercalation layer.

10. A neuromorphic device comprising:
    an ion intercalation layer arranged on a first electrode layer;
    an electrolyte layer arranged on the ion intercalation layer; and
    an ion permeable membrane arranged on the electrolyte layer, the ion permeable membrane forming a drain electrode.

11. The neuromorphic device of claim 10, wherein the electrolyte layer comprises a solid electrolyte material.

12. The neuromorphic device of claim 10, wherein the ion permeable membrane is carbon, metal, or a combination thereof.

13. The neuromorphic device of claim 10 wherein the ion permeable membrane is electrically conductive.

14. The neuromorphic device of claim 10, wherein the first electrode layer forms a source electrode.

15. The neuromorphic device of claim 10, wherein the ion intercalation layer is titanium oxide, tungsten oxide, lithium cobalt oxide, or a combination thereof.

16. The neuromorphic device of claim 10, wherein the electrolyte layer comprises lithium phosphorus oxynitride.

* * * * *